United States Patent
Locke et al.

(10) Patent No.: US 6,344,125 B1
(45) Date of Patent: Feb. 5, 2002

(54) PATTERN-SENSITIVE ELECTROLYTIC METAL PLATING

(75) Inventors: Peter S. Locke, Hopewell Junction; Kevin S. Petrarca, Newburgh; Seshadri Subbanna, Brewster, all of NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/544,053

(22) Filed: Apr. 6, 2000

(51) Int. Cl.[7] ................................. C25D 5/02
(52) U.S. Cl. ................. 205/118; 205/123; 205/157; 205/186; 205/239; 205/242; 205/247; 205/255; 205/257; 205/263; 205/264; 205/265; 205/266; 205/269; 205/270; 205/271; 205/291; 427/99
(58) Field of Search ................. 205/118, 123, 205/157, 186, 239, 242, 247, 255, 257, 263, 264, 265, 266, 269, 270, 271, 291; 427/99

(56) References Cited

U.S. PATENT DOCUMENTS

| | | | | |
|---|---|---|---|---|
| 4,624,749 A | * | 11/1986 | Black et al. | 204/15 |
| 5,968,333 A | * | 10/1999 | Nogami et al. | 205/184 |
| 5,969,422 A | * | 10/1999 | Ting et al. | 257/762 |
| 5,985,125 A | * | 11/1999 | Kim | 205/123 |
| 5,989,623 A | * | 11/1999 | Chen et al. | 427/97 |
| 6,004,440 A | * | 12/1999 | Hanson et al. | 204/279 |
| 6,020,266 A | * | 2/2000 | Hussein et al. | 438/694 |
| 6,024,856 A | * | 2/2000 | Haydu et al. | 205/84 |

* cited by examiner

Primary Examiner—Arun S. Phasge
(74) Attorney, Agent, or Firm—Ratner & Prestia; H. Daniel Schnurmann, E

(57) ABSTRACT

A process for the electrolytic deposition of a metal, preferably copper or an alloy of copper, directly onto a barrier layer coated on a dielectric layer. The process is advantageous because it electrolytically deposits metal in a pattern that is either the duplicate of a first conductive pattern under the dielectric or the inverse image of the first conductive pattern, depending on the first conductive pattern shape. Thus, metal is deposited on the barrier layer duplicating a first conductive pattern under the dielectric layer when the first pattern is a serpentine pattern and the metal deposits in the spaces between the conductive lines of a first conductive pattern of a discrete passive element such as a spiral.

20 Claims, 3 Drawing Sheets

PATTERN-SENSITIVE ELECTROLYTIC METAL PLATING

TECHNICAL FIELD

The present invention relates in general to metal plating processes and, more particularly, to a process for generating a patterned metal layer on an insulating substrate in the fabrication of semiconductor integrated circuits.

BACKGROUND OF THE INVENTION

In the production of semiconductors, it is often necessary to form patterned metal layers on the semiconductor or insulator surface to provide conductive areas that transfer electrical current. Typically, such patterned layers are produced in one of two ways. One way is to use the desired pattern to form a mask and then to deposit the metal onto the dielectric or insulator in the desired pattern through the mask.

In the alternative, the metal is deposited as a continuous, un-patterned layer over the dielectric surface. The deposition of the continuous metal layer may be done in any one of a number of ways, including vacuum deposition, sputtering, and electrolytic or electroless plating, to name a few. The continuous metal layer is later selectively etched using a process such as photolithography, to generate a desired metal pattern. Photolithography is a process in which a light source illuminates a circuit pattern and projects the image through a lens assembly onto a semiconductor wafer or substrate. Ultimately, the circuit pattern is etched into the wafer.

All processes have advantages and disadvantages and some are better suited than others for a particular purpose. The need for circuits offering higher performance, which often means higher speeds, has resulted in a need for conductive elements with high conductivity so as to minimize losses. As a result, copper, with its high conductivity, has become a desirable metal to be used in integrated circuit applications replacing the traditional aluminum conductors.

Copper and copper alloys exhibit superior electromigration properties and have a lower resistivity than aluminum. Thus, copper and its alloys are useful in very large scale integration (VLSI) interconnect metallizations (i.e., more than 100,000 devices per chip). In addition, copper has improved electrical properties when compared to tungsten, making copper a desirable metal for use as a conductive plug as well as conductive wiring. There are also disadvantages, however, attendant upon the use of copper For example, copper readily diffuses through silicon dioxide, the typical dielectric interlayer material used in the manufacture of semiconductor devices, and adversely affects the devices.

From the manufacturing point of view, patterned copper or copper alloys are difficult to produce. For one, copper etching is problematic. Wet chemical etchants etch isotropically and generally permit insufficient dimensional control for sub-micron devices. Dry etching is typically used, but some metal layers, such as copper and gold, are difficult to plasma etch or reactive ion etch at reasonable production temperatures. During the chemical etching, the metal layer to be patterned is inevitably subjected to what is called "side etching" by an amount dependent upon the length of chemical etching, resulting in the patterned metal layer becoming smaller than the pattern of the mask layer by the amount of side etching. The amount of side etching depends upon the temperature, the flow rate, and other conditions of the etchant used; therefore, it is very difficult to predict the amount of side etching. The subtractive etching process is not currently used to form patterned layers of copper because of the difficulties associated with chemical and plasma etch processes.

When copper is used as the metal for conductors in a patterned metal layer, the typical process involves depositing a conformal barrier layer on the dielectric substrate, usually a tantalum layer, using chemical vapor deposition. The barrier layer prevents copper diffusion into the dielectric. Over the barrier layer there is next deposited a thin layer of copper metal to provide a seed layer having high conductivity. The coated substrate is placed next in a standard electrolytic bath and connected to a voltage source while a source of copper is also in the bath connected to the same voltage source. Uniform electrolytic deposition over the seed layer is accomplished by passing a current through the system.

This technique produces a uniform layer of copper over the seed layer with good adhesion to the barrier layer The photolithography and etching processes, with their related problems discussed above, are used to generate the desired conductive pattern. The deficiencies of the conventional processes show that a need still exists for a process for direct deposition of preferred metals patterned onto dielectric substrates without having to produce a continuous layer that is subsequently etched to form a desired pattern.

SUMMARY OF THE INVENTION

To meet this and other needs, and in view of its purposes, the present invention provides a metal layer plating process that yields a patterned metal layer on an upper surface of a dielectric layer without masking or etching steps. More specifically, the present invention provides a process for controlling the electrolytic deposition of a first metal, such as aluminum, nickel, cobalt, silver, gold, palladium, platinum, rhodium, or copper; alloys of copper, of aluminum, of cobalt, of silver, of gold, of palladium, of platinum, of rhodium; and combinations of these metals and alloys, on a barrier layer comprising a refractory metal. The process comprises forming a first patterned conductive layer on a support, forming a dielectric layer over the support and conductive pattern, and forming a continuous barrier layer over the dielectric layer. The first patterned conductive layer may be an inductor, in the process of the present invention, or it may be a non-inductive conductive line pattern, such as a serpentine pattern. The process further comprises applying a current to the barrier layer while the barrier layer is immersed in an electrolytic bath.

Still more specifically, the process for forming a patterned metal layer on an upper surface of a dielectric layer comprises, according to the present invention, the following steps:

(a) forming a first conductive pattern on a substrate;

(b) forming a dielectric layer over the first conductive pattern and the substrate;

(c) forming a conformal barrier layer comprising a refractory metal on the upper surface of the dielectric layer; and (d) electroplating directly on the barrier layer a metal selected from the group consisting of aluminum, nickel, cobalt, silver, gold, palladium, platinum, rhodium, or copper; alloys of copper, of aluminum, of cobalt, of silver, of gold, of palladium, of platinum, of rhodium; and combinations of those metals and alloys, by flowing a current through the barrier layer while immersing the barrier layer in an electroplating bath, the deposited metal forming a patterned layer during the deposition.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. The figures also do not show additional elements that are not essential in describing the present invention. Included in the drawing are the following figures.

DETAILED DESCRIPTION OF THE INVENTION

Figure 1:
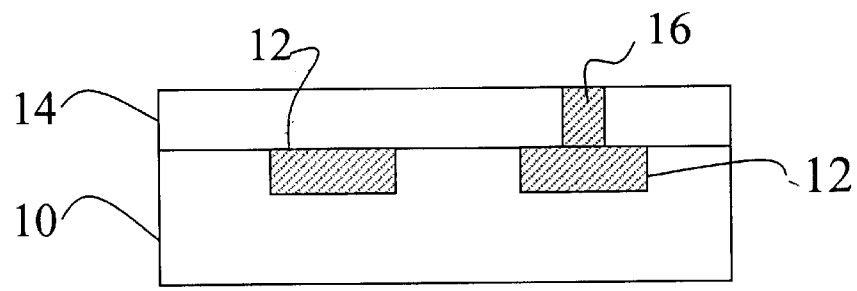
FIG. 1 schematically illustrates a cross-sectional view of a structure comprising a substrate with a conductive metal serpentine pattern and a dielectric layer including one metal-filled via extending between an upper surface of the dielectric and the metal serpentine pattern.

The invention will next be described with reference to the figures in which the same numbers indicate the same elements in all figures. Referring to FIG. 1, there is shown a supporting layer 10, which may be a silicon wafer, bearing on an upper surface of supporting layer 10 a first conductive pattern 12. First conductive pattern 12 may be created with any one of the traditional processes known in the art to produce patterned metal layers; the process of generating first conductive pattern 12 is not particularly critical in the practice of the present invention.

Typically, when supporting layer 10 is a silicon wafer on which integrated circuits are manufactured, first conductive pattern 12 may be created through chemical vapor deposition (CVD), sputtering, photo-imaging followed by etching, or any of the other known and used techniques for forming such patterns. CVD is a process for depositing a thin film of material onto a substrate by reacting the constituent elements in gaseous phase. CVD processes are used to produce thin, single-crystal films called epitaxial films.

Over supporting layer 10 and first conductive pattern 12 there is deposited a dielectric layer 14, as shown in FIG. 1. Dielectric layer 14 is a continuous layer fully covering first conductive pattern 12 and may include a number of vias 16 providing access between the surface of dielectric layer 14 and first conductive pattern 12 beneath dielectric layer 14. Vias 16 are typically filled with a conductive material to form an interconnect between circuitry placed on top of dielectric layer 14 and circuitry beneath dielectric layer 14.

Figure 2:
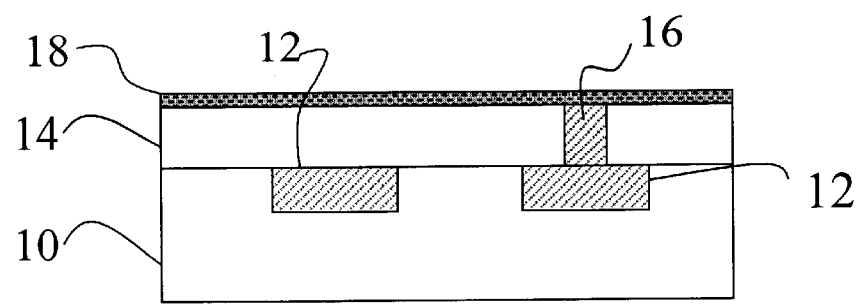
FIG. 2 shows the structure of FIG. 1 after a barrier layer has been deposited on the upper surface of the dielectric layer.

A barrier layer 18 is next deposited over dielectric layer 14 as shown in FIG. 2. Barrier layer 18 is a refractory metal such as tantalum, tungsten, tantalum nitride, tungsten nitride, and combinations of those materials. Other refractory metals may also be used such as Zr, Nb, Mo, Hf, and Re. A preferred barrier layer material is Ta or TaN. An even more preferred material for barrier layer 18 is a combination of Ta and TaN. Barrier layer 18 may be applied as a physical vapor deposition (PVD) or CVD layer having a thickness of between about 50 Å and about 1,000 Å. Barrier layers of this type are known in the art and their deposition techniques are also well known. See, for example, U.S. Pat No. 5,969,422 issued to Ting et al. or U.S. Pat. No. 5,989,623 issued to Chen et al.

The next step according to the present invention is the electrolytic deposition of a conductive metal layer over barrier layer 18 so as to form a patterned metal layer directly on barrier layer 18. In the electrolytic processes of the prior art, before immersing the sample in the electrolytic bath, a conductive metal seed layer is applied to the barrier layer. Such a step is described in both the patent issued to Ting et al. and the patent issued to Chen et al. This step is advantageously omitted by the present invention.

Instead, it has been surprisingly discovered that immersing barrier layer 18 in the electrolytic bath and flowing a current through barrier layer 18 causes electrolytic metal deposition that is pattern-dependent according to first conductive pattern 12 buried under dielectric layer 14. When the buried pattern is essentially a straight or serpentine line pattern, metal deposits on barrier layer 18 only in the areas over first conductive pattern 12, thereby reproducing the first pattern directly on barrier layer 18. On the other hand, if the first pattern is a discrete passive structure such as a spiral inductor, metal is deposited on dielectric layer 14 only in the areas outside first conductive pattern 12, in effect duplicating a negative or inverse of the buried pattern.

Aluminum, nickel, cobalt, silver, gold, palladium, platinum, rhodium, and copper are metals useful for the electrolytic deposition. Particularly useful are those metals exhibiting low magnetic properties. Alloys of copper, aluminum, cobalt, silver, gold, palladium, platinum, and rhodium are also suitable. Combinations of such metals and alloys can also be used for the electrolytic deposition. The most preferred metal is copper and the most preferred alloys are alloys of copper.

Figure 3:
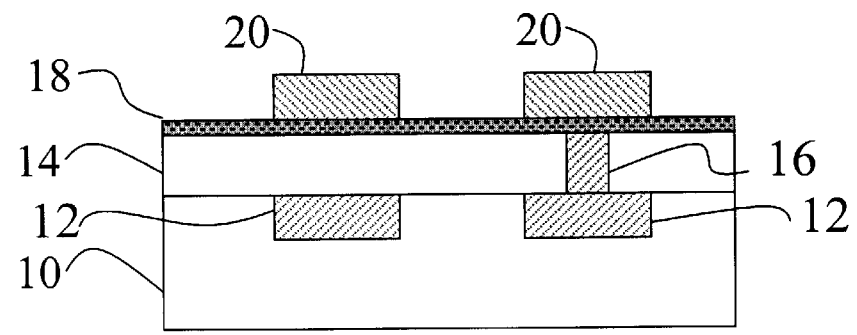
FIG. 3 shows the structure of FIG. 2 after electrolytic deposition of a metal in accordance with an embodiment of the present invention.
Figure 5:
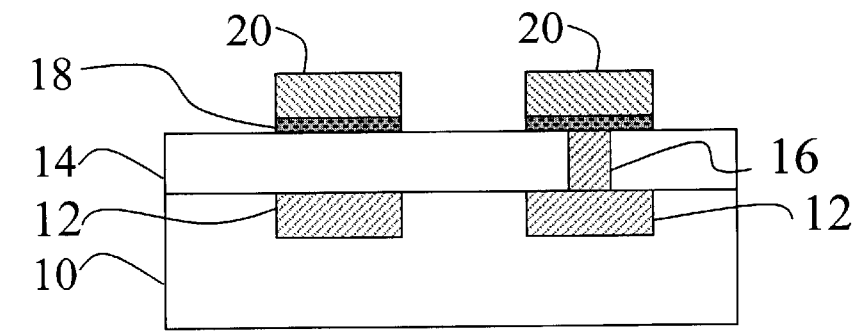
FIG. 5 shows the structure of FIG. 3 after the unplated regions of the barrier layer have been removed.
Figures 4, 6:
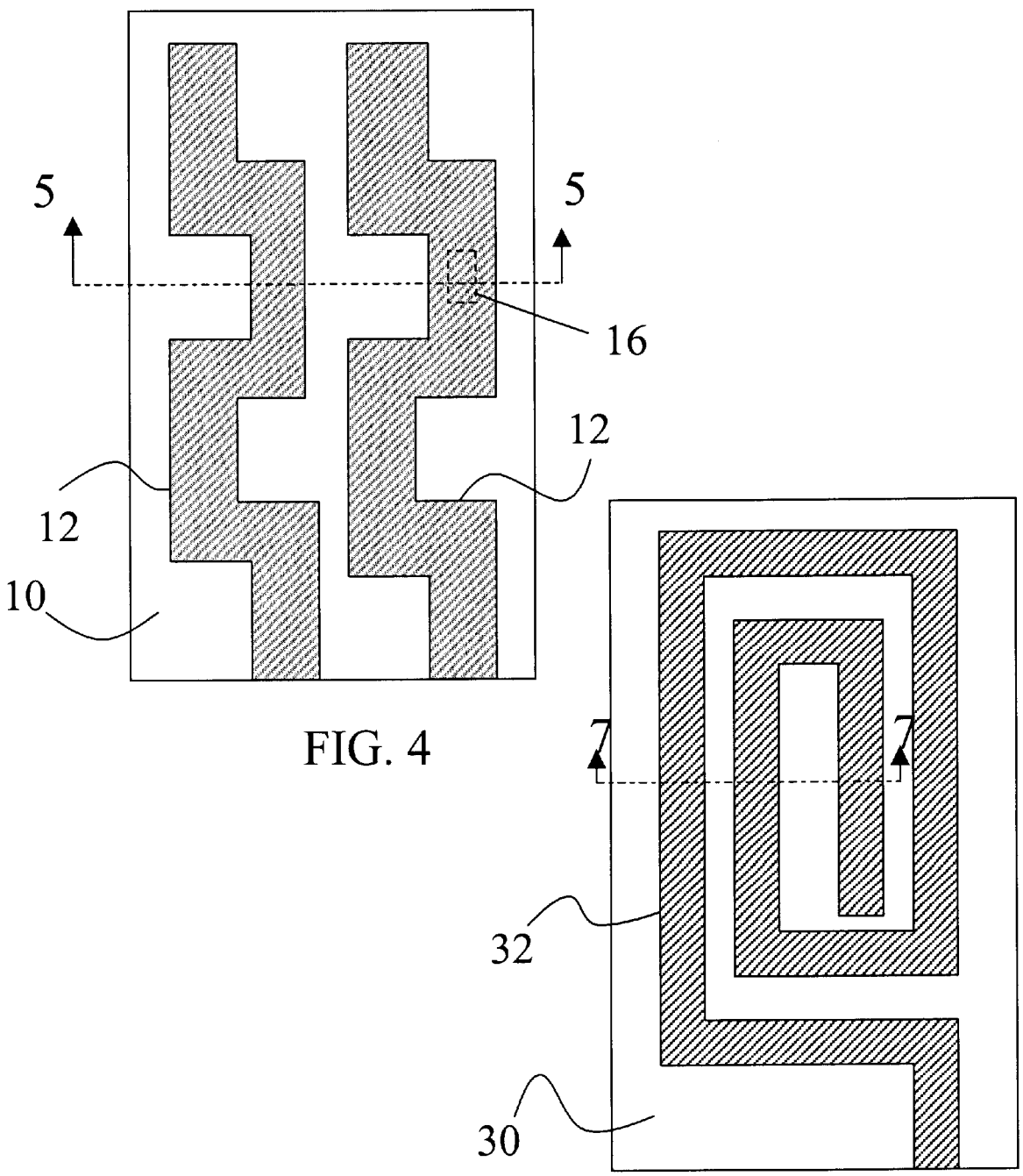
FIG. 4 shows a top view of a first, serpentine conductive pattern used in the embodiment of FIG. 1.
FIG. 6 shows a top view of a first, discrete, passive structure used as the conductive pattern in an alternate embodiment of the present invention.

FIG. 3 illustrates the embodiment in which the buried first pattern is either a straight line or a serpentine pattern (as shown in FIG. 4). As shown in FIG. 3, the metal 20, which is preferably copper or a copper alloy, deposits preferentially over first conductive pattern 12. Following the electrolytic deposition, barrier layer 18 is removed. Such removal creates the structure illustrated in FIG. 5, which shows a cross section view taken along arrows 5—5 in FIG. 4. Barrier layer 18 remains only in those areas beneath metal 20.

FIG. 6 shows a discrete passive structure 32 in the shape of a spiral inductor formed on a substrate 30. Structure 32 is a conductive metal deposited on substrate 30 to form the first conductive pattern. Although structure 32 can be any conductive metal, copper or a copper alloy is preferred. This metal pattern can be created by any of the traditional and well-known processes in the art including depositing a continuous layer and using photolithography to form the desired shape. Although a rectangular spiral shape is shown, any such spiral shape may be used including any polygon type such as a spiral pentagon, as well as a circular spiral.

Figure 7:
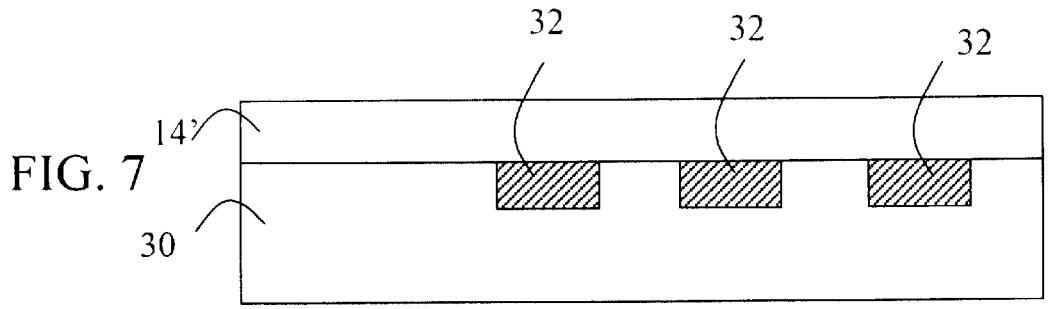
FIG. 7 is a schematic cross-section elevation view of the embodiment shown in FIG. 6 taken along arrows 7—7.

FIG. 7 shows a schematic cross section taken along arrows 7—7 of FIG. 6.

FIG. 7 shows substrate 30 and three of the spiral lines of discrete passive structure 32, including an outside line. FIG. 7 shows the wafer portion after a dielectric layer 14' has been placed over the first metal pattern and substrate 30.

Figure 8:
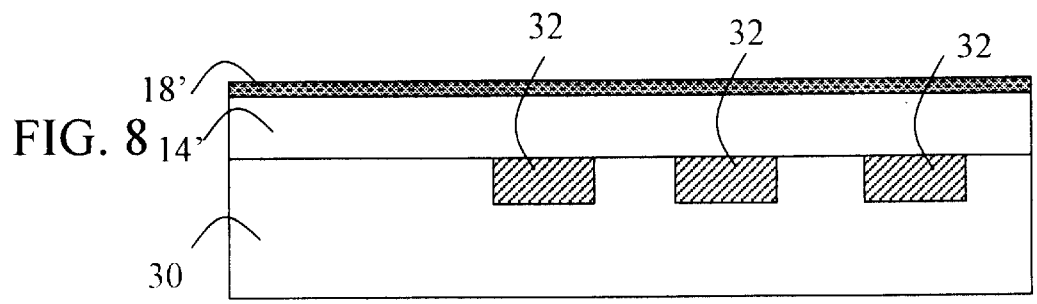
FIG. 8 shows the structure of FIG. 7 after a barrier layer has been deposited on the upper surface of the dielectric layer.
Figure 9:
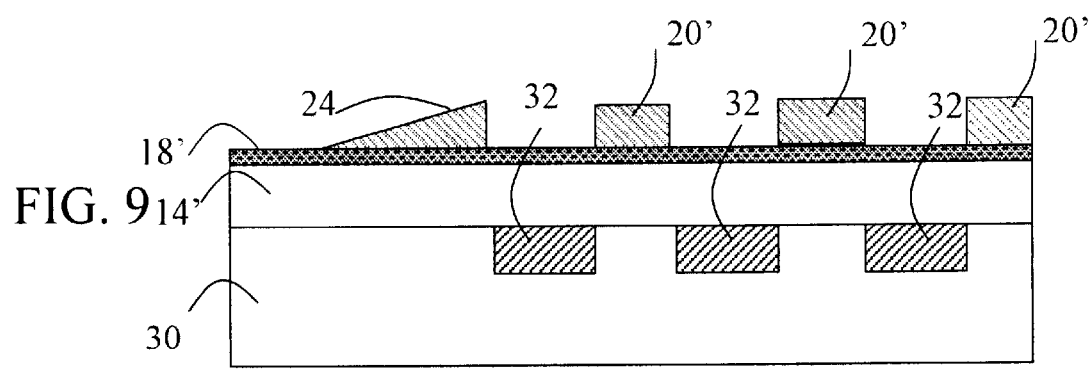
FIG. 9 shows the structure of FIG. 8 after electrolytic deposition of a metal in accordance with the present invention.

As previously done, a continuous barrier layer 18' is again coated over dielectric layer 14' and the wafer, schematically represented in FIG. 8, is placed in an electrolytic bath. Current is applied to barrier layer 18' and metal is deposited onto barrier layer 18' in a pattern that follows the spaces between the conductive lines of the spiral as shown in FIG. 9. The metal 24 is also deposited for a distance beginning from the edge of the outermost line of discrete passive structure 32 and tapering to a point where there is no metal deposition. The thickness of the deposited metal at the outside edge of the pattern line is typically less than the thickness of the metal 20' deposited between the pattern lines.

Figure 10:
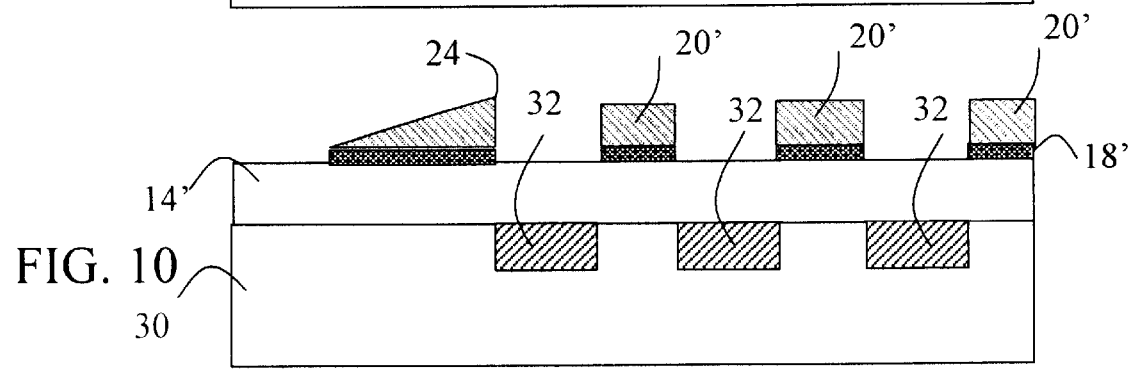
FIG. 10 shows the structure of FIG. 9 after the unplated regions of the barrier layer have been removed.

Removal of barrier layer 18' where it is exposed, leaves a conductive pattern over discrete passive structure 32 that is a negative image of the first pattern, as shown in FIG. 10. The pattern is conductive over the areas that were non-conductive in the first pattern and vice versa.

Preferably, in practice a machine such as the Sabre tool, manufactured by Novellus, or any comparable industry tool may be used for electroplating. The conventional plating program on the Novellus tool has a continuity check protocol which examines the continuity of the surface to verify the integrity of the metal seed layer. Therefore, when using this type of apparatus to practice the invention, in which the seed layer is absent, the continuity check protocol of the Novellus tool program must be deleted.

The preferred embodiment of the present invention includes additional modifications to the conventional Novellus tool program. Inherent to the Novellus tool is a small amount of copper sulfate and sulfuric acid at the plating contacts. In order to minimize undesired plating effects at the contacts, current is applied gradually in the plating protocol. Current of 1–2 amps is applied for 5–15 seconds, followed by full current application, 4.5 amps, for the remainder of the deposition. In the process according to the present invention, there is no high conductivity metal seed layer, such as copper, on the plating surface. Without a copper seed layer, the plating tool must apply an increased voltage to the barrier layer in order to maintain the constant plating current of 4.5 amps. Such voltage is, preferably, applied gradually.

Although illustrated and described above with reference to specific embodiments, the present invention is nevertheless not intended to be limited to the details shown. Rather, various modifications may be made in the details within the scope and range of equivalents of the claims and without departing from the spirit of the invention.

What is claimed:

1. A process for controlling the electrolytic deposition of a metal selected from the group consisting of aluminum, nickel, cobalt, silver, gold, palladium, platinum, rhodium, and copper, alloys of copper, aluminum, nickel, cobalt, silver, gold, palladium, platinum, and rhodium, and combinations thereof on a barrier layer comprising a refractory metal, the process comprising:

forming a first patterned conductive layer on a support;

forming a dielectric layer over the support and the first patterned conductive layer;

forming the continuous barrier layer over the dielectric layer; and flowing a current through the barrier layer while the barrier is immersed in an electrolytic bath.

2. The process according to claim 1 wherein the first patterned conductive layer is a discrete passive structure pattern.

3. The process according to claim 1 wherein the first patterned conductive layer forms a serpentine pattern.

4. A process for forming a patterned metal layer on an upper surface of a dielectric layer comprising:

(a) forming a first conductive pattern on a substrate;

(b) forming the dielectric layer over the first conductive pattern and the substrate;

(c) forming a conformal barrier layer comprising a refractory metal on the upper surface of the dielectric layer; and (d) electroplating directly on the barrier layer a metal consisting essentially of aluminum, nickel, cobalt, silver, gold, palladium, platinum, rhodium, and copper, alloys of copper, aluminum, nickel, cobalt, silver, gold, palladium, platinum, and rhodium, and combinations thereof by applying a current to the barrier layer while immersing the barrier layer in an electroplating bath.

5. The process according to claim 4 wherein the first conductive pattern forms a serpentine pattern.

6. The process according to claim 4 wherein the first conductive pattern forms a discrete passive structure.

7. The process according to claim 4 further comprising providing an electrically conductive via in the dielectric layer extending from the upper surface of the dielectric layer to the first conductive pattern.

8. The process according to claim 4 wherein the first conductive pattern is electrically isolated from the barrier layer.

9. The process according to claim 4 wherein the barrier layer consists essentially of Ta, TaN, W, WN, Zr, Nb, Mo, Hf, Re, and combinations thereof.

10. The process according to claim 4 wherein the barrier layer consists essentially of tantalum, tungsten, tantalum nitride, tungsten nitride, and combinations thereof and the metal electroplated thereon is copper or a copper alloy.

11. The process according with claim 4 wherein the first conductive pattern is formed on an insulating substrate.

12. The process according to claim 11 wherein the insulating substrate is silicon wafer.

13. The process according to claim 4 wherein the first conductive pattern on the substrate is fabricated by photolithography.

14. The process according to claim 4 wherein the first conductive pattern on the substrate is copper or a copper alloy.

15. The process according to claim 4 wherein in step (d) the current applied through the barrier layer is increased gradually.

16. The process according to claim 4 wherein in step (d) the current is applied to the first conductive pattern on the substrate.

17. The process according to claim 4 wherein following the deposition of the metal layer any of the barrier layer remaining uncovered by the metal layer is removed from the dielectric upper surface.

18. The process according to claim 4 wherein steps (b)–(d) are repeated at least one more time to form a second patterned metal layer over the patterned metal layer.

19. A process for forming a patterned metal layer on an upper surface of a dielectric layer comprising:

(a) forming a first conductive pattern on a substrate;

(b) forming the dielectric layer over the first conductive pattern and the substrate;

(c) providing an electrically conductive via in the dielectric layer extending from the upper surface of the dielectric layer to the first conductive pattern;

(d) forming a conformal barrier layer consisting essentially of Ta, TaN, W, WN, Zr, Nb, Mo, Hf, Re, and combinations thereof on the upper surface of the dielectric layer, the barrier layer electrically isolated from the first conductive pattern;

(e) electroplating directly on the barrier layer a metal layer consisting essentially of aluminum, nickel, cobalt, silver, gold, palladium, platinum, rhodium, and cooper, alloys of copper, aluminum, nickel, cobalt, silver, gold, palladium, platinum, and rhodium, and combinations thereof by gradually applying a current to the barrier layer while immersing the barrier layer in an electroplating bath; and (f) removing any of the barrier layer remaining uncovered by the metal layer from the dielectric layer upper surface.

20. The process according to claim 19 wherein the first conductive pattern forms one of a serpentine pattern and a discrete passive structure.

* * * * *